United States Patent
Hsu et al.

(10) Patent No.: US 6,338,813 B1
(45) Date of Patent: Jan. 15, 2002

(54) MOLDING METHOD FOR BGA SEMICONDUCTOR CHIP PACKAGE

(75) Inventors: Kao-Yu Hsu, Kaohsiung Hsien; Chun Hung Lin; Tao-Yu Chen, both of Kaohsiung, all of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/418,569

(22) Filed: Oct. 15, 1999

(51) Int. Cl.[7] .................. B29C 45/02; B29C 45/14; B29C 70/70
(52) U.S. Cl. .............. 264/272.14; 264/272.15; 264/272.17
(58) Field of Search ............. 264/272.14, 272.15, 264/272.17; 29/841, 848, 849; 425/116, 544; 438/112, 127

(56) References Cited

U.S. PATENT DOCUMENTS

| | | | |
|---|---|---|---|
| 4,900,501 A | | 2/1990 | Saeki et al. |
| 4,983,110 A | | 1/1991 | Yoshida et al. |
| 5,490,324 A | * | 2/1996 | Newman ............ 29/830 |
| 5,656,549 A | * | 8/1997 | Woosley et al. ...... 438/118 |
| 5,961,912 A | * | 10/1999 | Huang et al. ...... 264/272.15 |
| 6,013,947 A | * | 1/2000 | Lim ............... 264/272.17 |
| 6,014,318 A | * | 1/2000 | Takeda ........... 264/272.17 |
| 6,031,281 A | * | 2/2000 | Kang et al. ......... 257/692 |
| 6,114,189 A | * | 9/2000 | Chia et al. .......... 438/112 |
| 6,164,946 A | * | 12/2000 | Mess ............... 425/125 |
| 6,173,490 B1 | * | 1/2001 | Lee et al. ............ 29/841 |

* cited by examiner

Primary Examiner—Angela Ortiz

(57) ABSTRACT

A molding method for a BGA semiconductor chip package comprising a substrate supporting an array of chips having two lines of bonding pads formed at two respective side thereof. The molding method comprises the steps of: (A) providing a molding apparatus comprising a molding die having a molding cavity and at least two runners connected to the molding cavity; (B) closing and clamping the molding die in a manner that the chips are located in the molding cavity thereof; (C) transferring a molding compound into the molding cavity wherein each chip is arranged in a manner that the two lines of bonding pads thereof are substantially perpendicular to the flowing direction of the molding compound; (D) curing the molding compound; and (E) unclamping and opening the molding die to take out the molded product.

8 Claims, 5 Drawing Sheets

MOLDING METHOD FOR BGA SEMICONDUCTOR CHIP PACKAGE

BACKGROUND OF THE INVENTION

1. Field of the Invention

This invention generally relates to a molding method for a semiconductor chip package and more particularly to a molding method for a BGA semiconductor chip package.

2. Description of the Related Art

FIG. 1 illustrates a molding device for a conventional BGA (ball grid array) semiconductor chip package. The molding device comprises a plurality of pots 2. Two substrates 20 are placed at two sides of the pot 2 for supporting an array of chips 12. The runner 3 independently extends from one side of the pot 2 to the corner of the substrate 20, and connects to the upper part of a mold disposed on the substrate 20 through a gate 4. Under the pressure created by the plunger 15, the molding compound 14 is forced out of the pot 2 and then passes through the runner 3 and the gate 4 to enter the cavity of the upper part of the mold. When the molding compound 14 fills the cavity, the plunger 15 stands still for a predetermined time until the molding compound 14 cures. Then the plunger 15 is raised, the top part of the mold is opened, and the molded product is removed from the mold. Extra parts such as runners and gates are removed from the molded product, and then the molded product is sawed into individual units, whereby the BGA semiconductor chip packages are completed.

According to the molding device for a conventional BGA semiconductor chip package described above, since the molding compound 14 is transferred into the cavity of the upper part of the mold through the gate 4 on the corner of the substrate 20, the pressure of the molding compound distributed unevenly inside the cavity during encapsulation thereby creating the problem of wire sweeping and molding defects such as voids or holes. Further, since the flow path of the molding compound within the cavity is longer, the period of the molding cycle is prolonged and variations of the property of the molding compound between different positions due to heating are enlarged thereby influencing the molding quality.

SUMMARY OF THE INVENTION

It is a primary object of the present invention to provide a molding method for a BGA semiconductor chip package wherein the problem of wire sweeping is improved thereby increasing the yield of product.

It is another object of the present invention to provide a molding method for a BGA semiconductor chip package which is effected by a molding die having a cavity connected to a plurality of runners interconnected by a molding pressure balancing device allowing effective controlling of the molding compound such that the flowing and filling thereof are more even thereby reducing the period of encapsulation, and thereby improving the molding quality.

A molding method in accordance with the present invention is used to encapsulate an array of chips having two lines of bonding pads formed at two respective side thereof. Each chip is electrically interconnected to a substrate through a plurality of bonding wires. The molding method comprises: (A) providing a molding apparatus comprising a molding die having a molding cavity and at least two runners connected to the molding cavity; (B) closing and clamping the molding die in a manner that the chips are located in the molding cavity thereof; (C) transferring a molding compound into the molding cavity wherein each chip is arranged in a manner that the two lines of bonding pads thereof are substantially perpendicular to flowing direction of the molding compound; (D) curing the molding compound; and (E) unclamping and opening the molding die to take out the molded product. According to the molding method of the present invention, the two lines of bonding pads of each chip are substantially perpendicular to the flowing direction of the molding compound, hence the bonding wires are substantially parallel to the flowing direction of the molding compound such that the influence of the molding compound is suppressed thereby reducing the occurrence possibility of wire sweeping and increasing the yield of product.

The molding apparatus in accordance with the present invention preferably includes a molding pressure balancing device for providing interconnection between the runners thereby balancing the pressure of molding compound inside each runner whereby the molding compound can be transferred into the molding cavity more evenly.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

The present invention discloses a molding method for encapsulating a plurality of semiconductor chips to obtain a BGA semiconductor chip package wherein the problem of wire sweeping is improved thereby increasing the yield of product.

Figure 1:
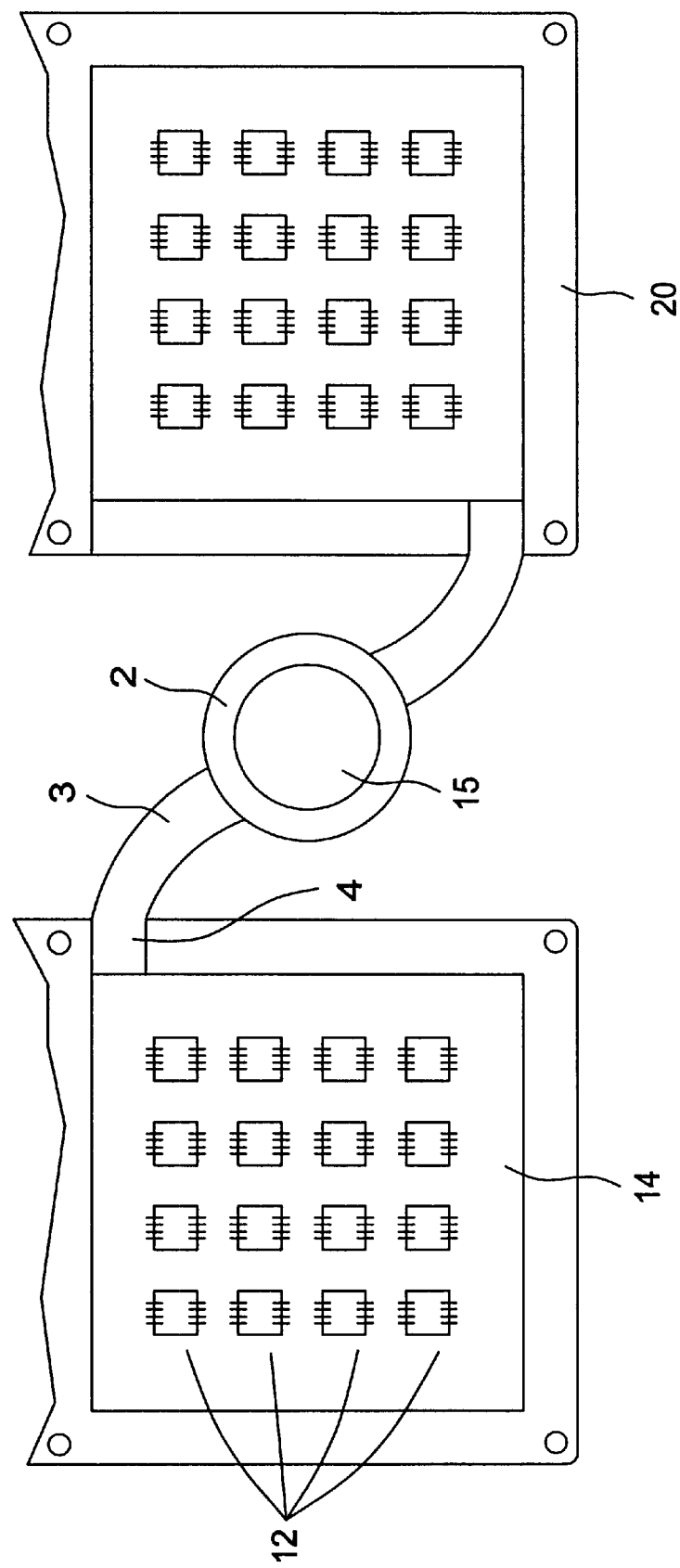
FIG. 1 is a top plan view of an array of chips mounted on a substrate installed in a conventional molding device.
Figure 2:
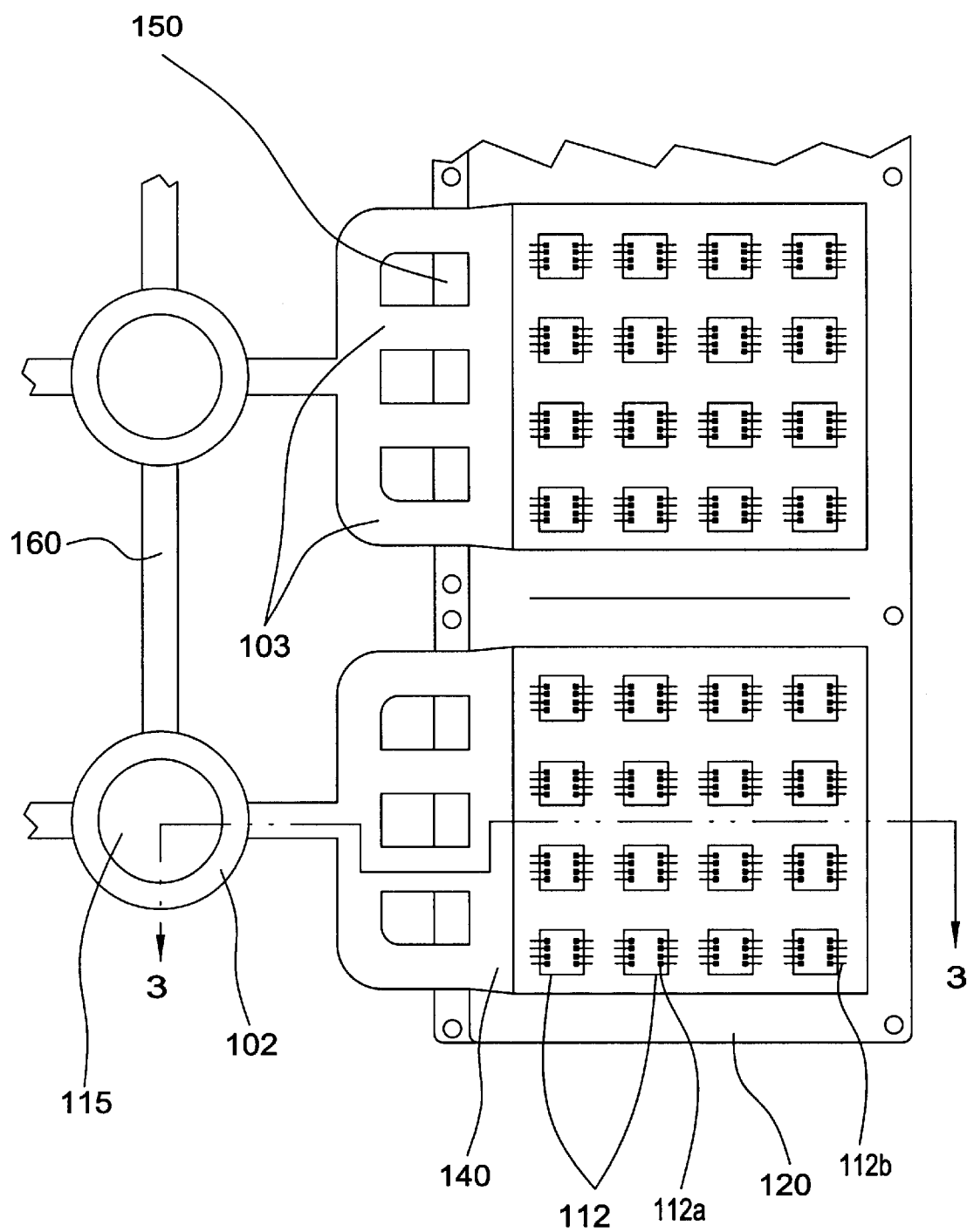
FIG. 2 is a top plan view of an array of chips mounted on a substrate installed in a molding apparatus in accordance with the present invention.
Figure 3:
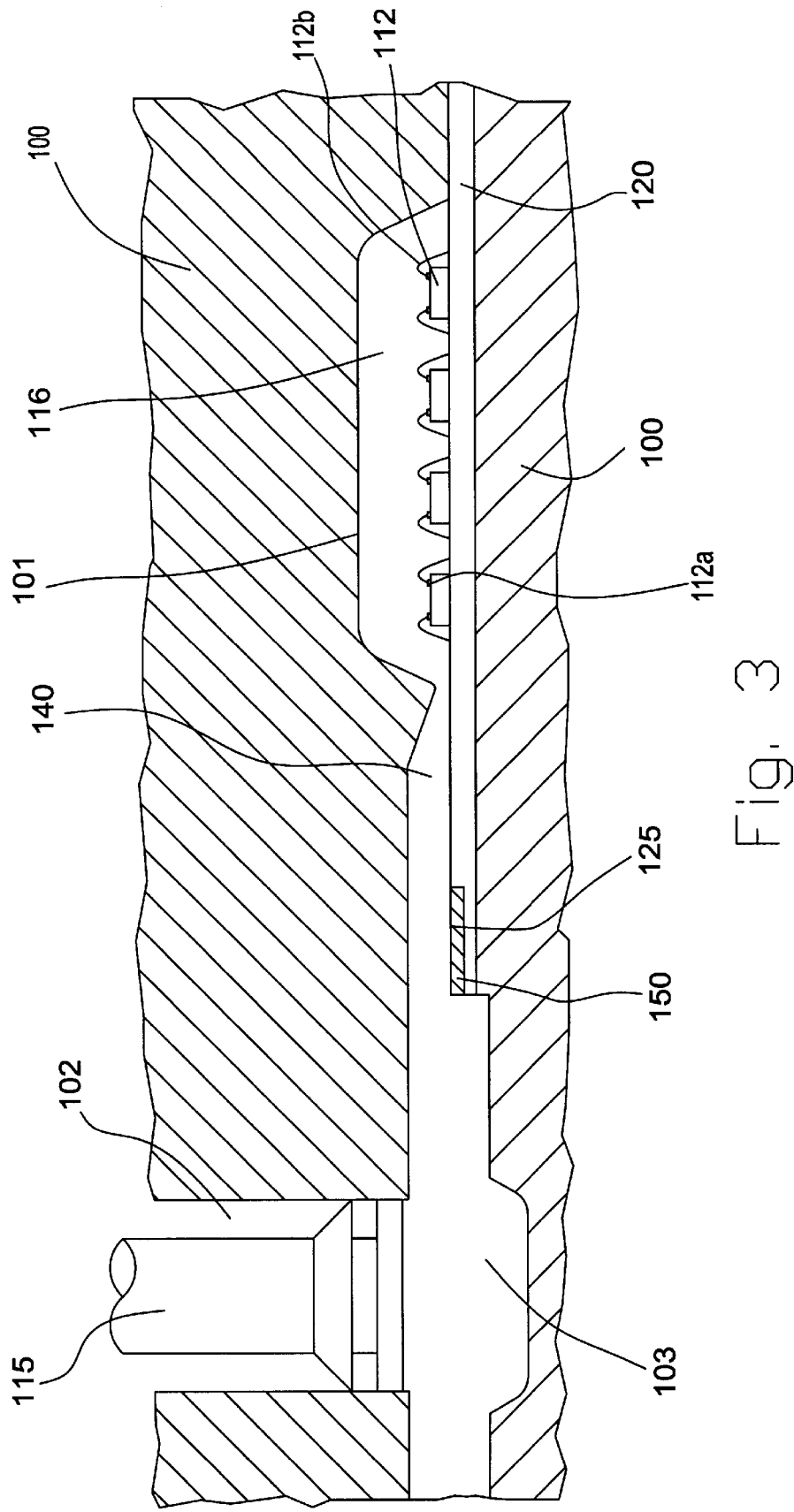
FIG. 3 is a cross sectional view taken from the line 3—3 of FIG. 2.

The molding method of the present invention comprises the following steps:

(A) Provides a molding apparatus (referring to FIG. 2 and FIG. 3). The molding apparatus comprises a molding die 100 having at least a molding cavity 101 (two cavities are illustrated in FIG. 2) shaped generally to conform to the to-be-molded shape of the BGA semiconductor chip package. The mold die 100 has at least two runners 103 (four runners are illustrated in FIG. 2) connecting to the molding cavity 101. The molding apparatus further comprises at least a pot 102 (two pots are illustrated in FIG. 2) for receiving the molding compound. Each pot 102 is connected to at least two runners 103 (there are four runners connecting to each pot illustrated in FIG. 2).

(B) Close and clamp the molding die 100 in a manner that the plurality chips 112 are located in the molding cavity 101 thereof.

Figure 4:
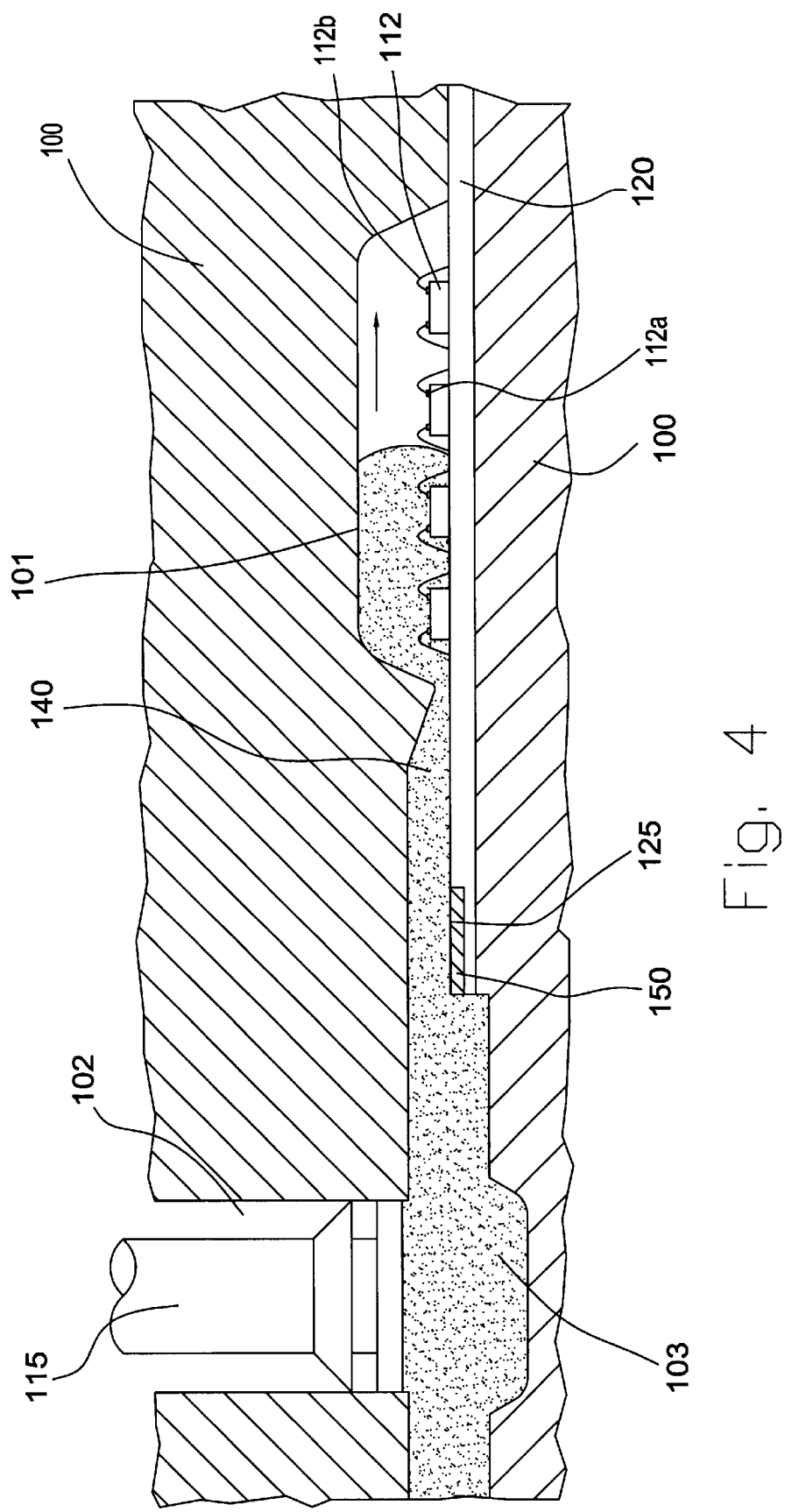
FIG. 4 is a schematic cross sectional view for illustrating the encapsulating process of the chips mounted on the substrate installed in the molding apparatus of FIG. 2.
Figure 5:
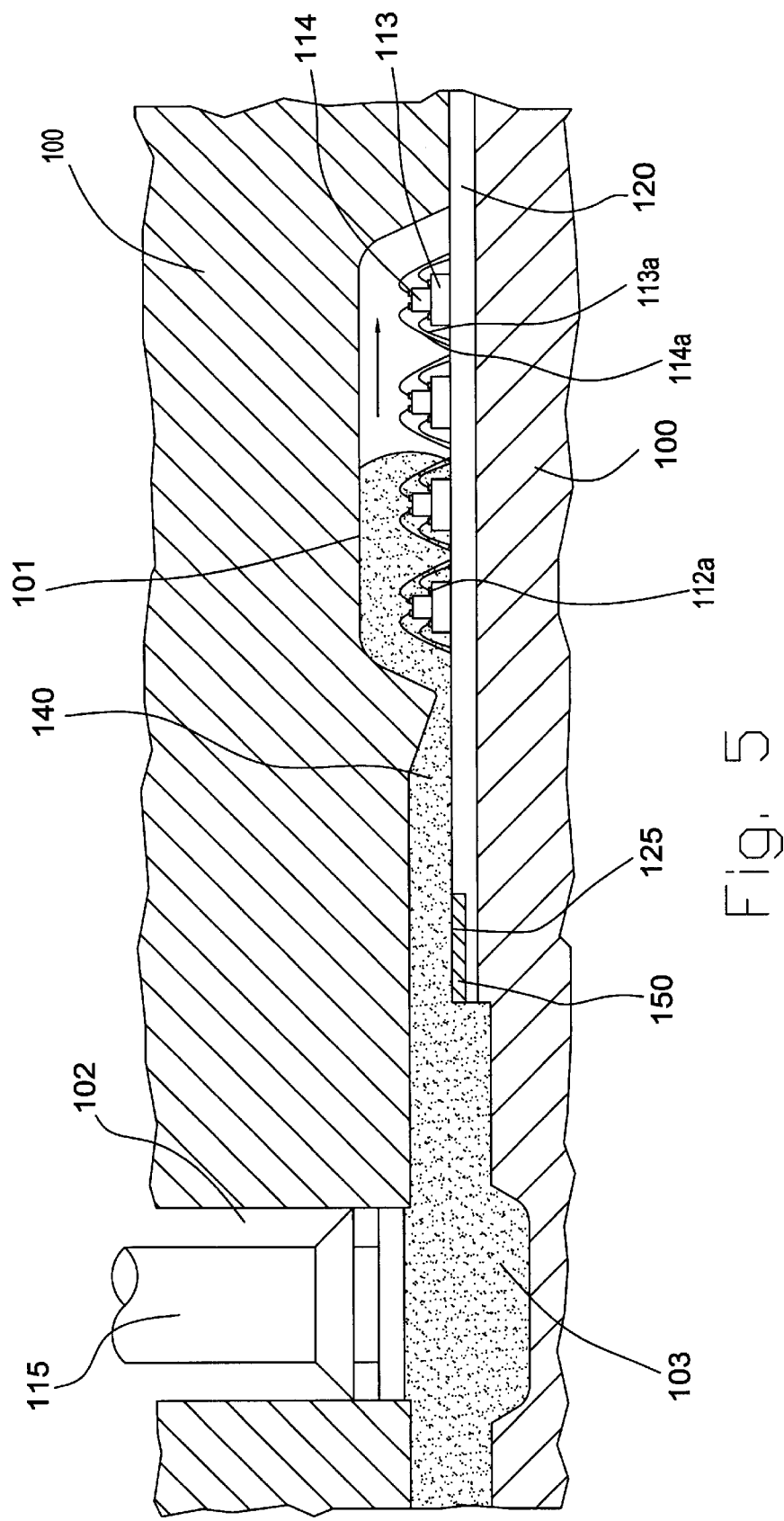
FIG. 5 is a schematic cross sectional view for illustrating the encapsulating process of stacked chips mounted on a substrate installed in the molding apparatus of FIG. 2.

(C) Place the molding compound in the pot 102 and move the plunger 115 (down in FIG. 4) to compress the molding compound. The molding die 100 and the molding compound are pre-heated so that when the plunger 115 compresses the molding compound, the liquefied molding compound is forced through the runner 103 to fill the molding cavity 101. It should be noted that the present invention is characterized in that each chip 112 is arranged in a manner that the two lines of bonding pads 112a thereof are substantially perpendicular to flowing direction (as indicated by the arrow shown in FIG. 4) of the molding compound, hence the bonding wires 112b for electrically interconnecting the chips 112 to a substrate 120 are substantially parallel to the flowing direction of the molding compound.

(D) Let the plunger 15 stand still for a predetermined time until the molding compound cures.

(E) Unclamp and open the molding die 100 to take out the molded product.

It should be understood that extra parts such as runners and gates are removed from the molded product during the degating process, and then the molded product is sawed into individual units, whereby the BGA semiconductor chip packages are completed The molding apparatus in accordance with the present invention preferably includes a molding pressure balancing device 140 for providing interconnection between the runners 103 thereby balancing the pressure of molding compound inside each runner whereby the molding compound can be transferred into the molding cavity more evenly.

It could be understood that the number of the runners of the molding apparatus in accordance with the present invention is based on that of the rows of the array of chips i.e. the four rows of chips 112 and four runners 103 as shown in FIG. 2 and the runners 103 are disposed corresponding to the array of chips. Therefore, the molding compound flows through the bonding wires of each chip with least resistance thereby reducing the occurrence possibility of wire sweeping.

Referring to FIG. 2 again, the molding apparatus according to the present invention preferably includes a connection pipe 160 for providing interconnection between the pots 102 thereby balancing the pressure of molding compound inside each pot 102 such that the molding compound can be forced into the molding cavity 101 more evenly under the compression of the plunger 115.

According to the present invention, the substrate 120 further comprises a degating region 125 with a degating region material 150 formed thereon (as shown in FIG. 3). The adhesion between the package body 116 formed after the curing of the molding compound and the degating region material 150 is smaller than that between the substrate 120 and the package body 116. The degating region is located on the surface of the substrate 120 within the runners 103. The degating region material is preferably gold. After the molding compound is cured and opening the molding die 100, the molding compound formed within the degating region 125 can be easily peeled off since the adhesion between the package body 116 and the degating region material 150 is smaller than that between the substrate 120 and the package body 116, hence the degating process is easily accomplished. In accordance with the present invention, the degating region material 150 can be formed under the surface of the substrate 120 thereby strengthening the rigidity of the substrate 120 at the runner 103. Further, the degating region material 150 can be formed on the sides of the substrate 120 thereby preventing the warpage of the substrate due to heat and pressing, which, in turn prevents final products from damages due to the leakage of the molding resin to the backside surface of the substrate.

The molding method of the present invention can be used to encapsulate an array of stacked chips to form a stacked chip package device. The stacked chip package device comprises an array of stacked chips disposed on a upper surface of a substrate 120. Each set of stacked chips includes a first chip 113 stacked with a second chip 114 wherein the backside surface of the first chip 113 is securely attached onto the substrate 120 and the backside surface of the second chip 114 is securely attached onto the active surface of the first chip 113. Two lines of bonding pads 113a, 114a are respectively provided on the active surfaces of the chips 113, 114 and electrically interconnected to the substrate 120 through a plurality of bonding wires 113b, 114b. Comparing to the conventional BGA package, the distance from the bonding pads 114a on the chip 114 to the substrate 120 is longer and the bonding wires 113b, 114b must be spaced apart to avoid electrical shorts, hence the bonding wires 114b are prone to have problems of wire sweeping. Therefore, the molding method of the present invention has marked effectiveness on applying to manufacture the stacked chip package device.

According to the molding method of the present invention, the two lines of bonding pads of each chip are substantially perpendicular to the flowing direction of the molding compound, hence the bonding wires are substantially parallel to the flowing direction of the molding compound such that the influence of the molding compound is suppressed thereby reducing the occurrence possibility of wire sweeping, thereby increasing the yield of product.

Further, the substrate in accordance with the present invention is provided with a degating region material formed on the degating region thereof, hence the molding compound formed within the degating region can be easily peeled off since the adhesion between the package body and the degating region material is smaller than that between the substrate and the package body. The present invention also discloses a molding method allowing effective controlling of the molding compound such that the flowing and filling thereof are more even thereby reducing the period of encapsulation.

Although the invention has been explained in relation to its preferred embodiment, it is to be understood that many other possible modifications and variations can be made without departing from the spirit and scope of the invention as hereinafter claimed.

What is claimed is:

1. A molding method for a BGA semiconductor chip package comprising a substrate supporting an array of chips each having only two lines of bonding pads formed at two opposing sides thereof, the molding method comprising the steps of:

providing a molding apparatus comprising a molding die having a molding cavity and at least a runner connected to the molding cavity;

closing and clamping the molding die in a manner that the chips are located in the molding cavity thereof;

transferring a molding compound into the molding cavity wherein each chip is arranged in a manner that the two lines of bonding pads thereof are substantially perpendicular to the flowing direction of the molding compound;

hardening the molding compound; and unclamping and opening the molding die to remove the molded product.

2. The molding method as claimed in claim 1, wherein the molding apparatus further comprises a molding pressure balancing device for providing interconnection between the runners thereby balancing the pressure of molding compound inside each runner whereby the molding compound can be transferred into the molding cavity more evenly.

3. The molding method as claimed in claim 1, wherein the molding apparatus comprises a plurality of pots connected the runners for receiving the molding compound and the molding apparatus further comprises a connection pipe for providing interconnection between the pots thereby balancing the pressure of molding compound inside each pot.

4. The molding method as claimed in claim 1, wherein the molding apparatus comprises multiple runners connected to the molding cavity of the molding die, each of said multiple runners is aligned with a row of the array of chips.

5. The molding method as claimed in claim 1, wherein the substrate further comprises a degating region on the surface thereof at a location such that the edges of the runners fit entirely within the degating region during encapsulation of the chip package, and the degating region has a degating region material formed thereon.

6. The molding method as claimed in claim 5, wherein the degating region material is gold.

7. The molding method as claimed in claim 1, wherein the BGA semiconductor chip package is a stacked chip package device.

8. A method of forming a molded semiconductor chip package, comprising the steps of:

providing a semiconductor chip package including a substrate supporting an array of chips, each of said chips being connected to the substrate by a plurality of bonding wires contained in substantially parallel planes;

providing a molding apparatus including a molding cavity communicated with at least one runner channel;

placing the semiconductor chip package in said molding cavity so that the planes containing the bonding wires of said chips are substantially parallel to a longitudinal direction of said at least one runner channel;

transferring a molding compound through said at least one runner channel into the molding cavity;

curing the molding compound; and removing the molded semiconductor chip package after the molding material is cured.

* * * * *